May 16, 1950 W. A. SCHAPER 2,508,338

PERMEABILITY TUNING MECHANISM

Filed July 13, 1946

INVENTOR.
WILLIAM A. SCHAPER.
BY Albert C. Bell
ATTORNEY

Patented May 16, 1950

2,508,338

UNITED STATES PATENT OFFICE 2,508,338

PERMEABILITY TUNING MECHANISM

William A. Schaper, Cicero, Ill., assignor to Aladdin Industries, Incorporated, a corporation of Illinois Application July 13, 1946, Serial No. 683,303

6 Claims. (Cl. 74—10.7)

The invention pertains to an improved construction of tuning mechanism for radio circuits, in which two different circuits, for example, an antenna circuit and an oscillator circuit, may be tuned by the simultaneous movement of ferromagnetic cores respectively associated with inductance windings in said circuits to effect the permeability tuning of said circuits by changing the inductance thereof. In the past it has been proposed to effect the permeability tuning of two such circuits by mechanisms of one kind or another, employing a crosshead operated by a tuning knob, the crosshead being mounted on the casing of the apparatus so that it is limited to rectilinear movement, by guiding rods or similar devices supported by the casing of the apparatus. By the present invention, a crosshead of special construction is employed supported directly by the edge portions of parallel slots in a mounting plate, for example, the front wall of the casing of the apparatus, so that special supporting and guiding mechanism for the crosshead is entirely dispensed with, the crosshead being constructed at the same time to extend on opposite sides of the shaft carrying the tuning knob, so that the tuning movement of the crosshead may be nearly as great as the height of the mounting plate or casing of the tuning apparatus. This provides for tuning movement of the ferromagnetic cores employed, which is substantially equal to the height of the mounting plate or casing, thereby reducing the height of the apparatus to the minimum compatible with the amount of movement required of the ferromagnetic cores to tune the circuits of the tuning mechanism over the frequency ranges that may be required. The crosshead construction is preferably of flat sheet material having an open top portion and laterally spaced and vertically extending legs that may occupy positions on opposite sides of the shaft of the tuning mechanism, said crosshead being mounted adjacent the outer surface of the front wall of the casing, but free from electric contact therewith, preferably by blocks of bearing and/or insulating material connected with the ends of the legs of the crosshead and also with the mid-portion thereof, which blocks are provided with grooves engaging the edge portions of the parallel slots in the mounting plate, to hold the crosshead in the position described and at the same time to permit its rectilinear movement required for the operation of the ferromagnetnc cores involved in the tuning operations. The blocks carried by the ends of the legs of the crosshead extend rearwardly from the mounting plate, to engage slender rods extending from the ferromagnetic cores, so that said blocks also serve as operating connections between the crosshead and the cores. The bearing block connected with the mid-portion of the crosshead is secured to a rearwardly extending portion of the crosshead connected with a flexible band passing around a drum carried by the tuning shaft, so that rotation of the shaft will move the crosshead and the attached cores to effect the desired tuning operations.

The flexible band employed to operate the crosshead is in the form of an endless loop extending at its lower end around a fixed abutment projecting rearwardly from the lower portion of the mounting plate, thereby avoiding the use of an idler wheel at the lower end of the flexible band to give desired direction to the side members of said band, and this in turn reduces the required vertical height of the apparatus to a minimum. The rearward extension of the mid-portion of the crosshead is connected with one side member of the flexible band, so that by imparting angular movement to the tuning shaft, rectilinear movement is imparted to the crosshead and to the ferromagnetic cores connected therewith.

The parallel slots in the mounting plate are provided at their ends with enlarged clearance openings by which the crosshead and its bearing blocks may be assembled as a unit, and then mounted on the mounting plate without the use of special tools and without the use of special devices for holding the crosshead in assembled position after it is in place on the mounting plate.

The invention also provides an improved construction for mounting the inductance windings of the tuning unit on the rear surface of the mounting plate consisting of yokes of insulating material which are of U-shape, so that the ends of the yokes will support the inductance windings desired distances back of the mounting plate, said yokes having formed tongues which extend through slots in the mounting plate which are parallel with each other and with the crosshead slots, the yoke tongues having enlarged heads to hold them in place on the mounting plate. The yoke slots are provided at their ends with enlarged clearance openings, so that the coil forms and inductance windings may be completely assembled on said yokes before mounting said yokes on the mounting plate, after which the completed inductances may be readily assembled on the mounting plate, without the use of special tools or retaining devices of any kind, but at the same time leaving the yokes free to be moved longitudinally of the yoke slots for aligning purposes after which the yokes are permanently held in position by suitable cement.

As a result of the construction described, the inductance windings may be spaced from each other no greater an amount than required for efficient operation, and they may at the same time be spaced from the mounting plate no greater an amount than required for such operation, which contributes to the production of a combined permeability tuning unit having a minimum height, width and depth.

To complete the resonant circuits of the inductance windings, fixed capacitors are preferably supported by a wall of the casing and connected in any desired manner with said windings.

Provision is made for the accurate aligning of the resonant circuits of the tuning unit with each other, to meet the requirements of any particular case, which aligning means does not constitute a part of the present invention and is not claimed herein.

The invention will be best understood by reference to the accompanying drawings in which.

Figures 1, 2, 3, 4, 5, 6:
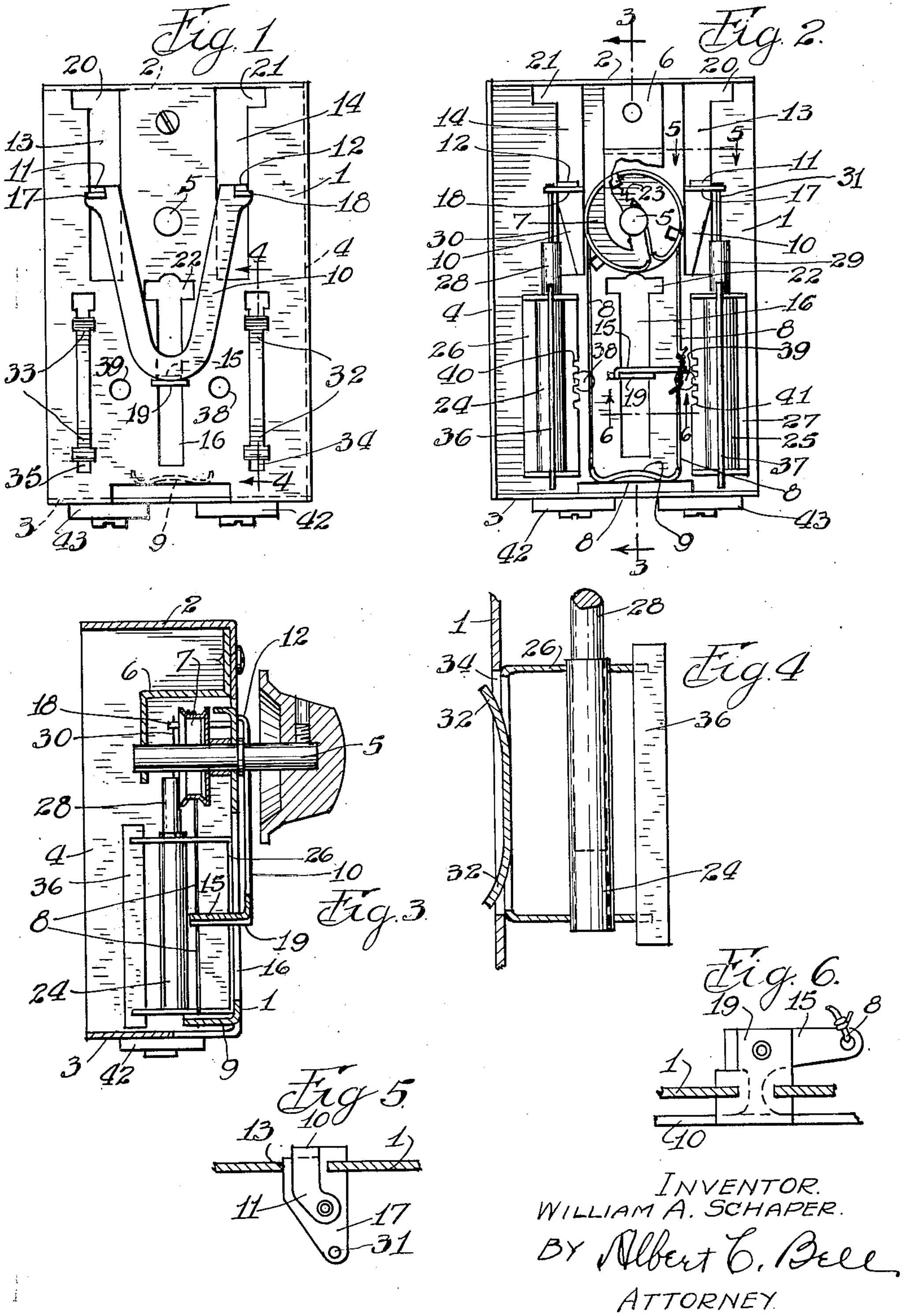
Fig. 1 is a front elevation of the tuning unit with the tuning knob removed.
Fig. 2 is a rear elevation of the structure shown in Fig. 1.

Fig. 3 is a vertical, sectional view through the parts shown in Fig. 2 taken along the line 3—3 in Fig. 2, and Figs. 4, 5 and 6 are detail sectional views to an enlarged scale, of parts of the structure shown in Figs. 1 and 2, taken respectively along the lines 4—4 in Fig. 1, and 5—5 and 6—6 in Fig. 2.

Similar numerals refer to similar parts throughout the several views.

As shown in Figs. 1, 2 and 3, the mounting plate of the tuning mechanism is exemplified as comprising the front wall 1 of a casing, which casing also has top and bottom walls 2 and 3 and a side wall 4, said tuning mechanism including a tuning shaft 5 supported in horizontal position by the front wall 1 and by a Z-shaped bracket 6 secured to the front wall and extending rearwardly therefrom. The shaft 5 has rigidly secured thereto a drum 7 from which an endless flexible band 8 extends downwardly and around a fixed abutment 9, which band may be a flexible cord or wire.

A crosshead 10, preferably of flat sheet material is mounted in front of and closely adjacent the front wall 1 but out of contact therewith, said crosshead being U-shaped or similarly formed with an open top portion and laterally spaced and vertically extending side legs. The upper ends 11 and 12 of the legs of the crosshead 10 are bent rearwardly, and extend through parallel slots 13 and 14 in the front wall 1 on opposite sides of the shaft 5, and the mid-portion of the crosshead is provided with a rearwardly projecting member 15 extending through a slot 16 in the front wall 10 parallel with the slots 13 and 14. The bent ends 11 and 12, as more clearly shown for the end 11 in Fig. 5, have secured thereto bearing blocks 17 and 18 respectively, which are notched at their outer edges to engage the adjacent edges of the slots 13 and 14 with a sliding fit, so that said blocks together serve to hold the upper portion of the crosshead in operative position adjacent the outer surface of the front wall 1 of the casing, but out of electrical contact therewith. As more clearly shown in Fig. 6, the projection 15 from the mid-portion of the crosshead is secured to a bearing block 19 having edged notches which are sliding fits on the corresponding edges of the slot 16, so that the blocks 17, 18 and 19 together maintain said crosshead in the position described, for rectilinear movement vertically of the front wall 1 of the casing. The slots 13, 14 and 16 are provided at their upper ends with enlarged clearance openings 20, 21 and 22 so that the crosshead and blocks described may after they are connected with each other, be mounted on the front wall 1 without the use of special tools and without the use of retaining devices, and retained in that position, since the crosshead in use is not moved vertically to a position aligning the bearing blocks with the said clearance openings.

The crosshead projection 15 extends into alignment with one of the side members of the flexible band 8, and said band is preferably rigidly secured to said projection under sufficient stress so that a tensioning spring 23 connected with the drum 7 and engaging said band, will maintain a desired tension on said band. The abutment 9 is provided with a shallow groove to hold the band 8 against displacement relatively to said abutment and the friction of the band on the abutment serves to hold the shaft 5 in any position to which it may be turned.

Coil forms 24 and 25 are mounted on the rear surface of the front wall 1 by means of U-shaped yoke members 26 and 27 of insulating material, so that the axes of the said coil forms are parallel with the slots 13, 14 and 16. Said coil forms contain ferromagnetic cores 28 and 29, the upper ends of which have secured thereto thin rods or operating wires 30 and 31, the upper ends of which extend through openings therefor in the blocks 18 and 17 and are held in operative position relatively to said blocks in any convenient way, for example by solder or cement applied to the junction of the blocks with said wires. The blocks 18 and 17 thereby impart movement to the cores 28 and 29 corresponding to movement of the crosshead 10.

As more clearly shown in Fig. 4 for the yoke 26, the yokes 26 and 27 are provided with tongues 32 and 33 formed from the material of the yokes and extending through slots 34 and 35 in the front wall 1 parallel with the slots 13, 14 and 16, said tongues being provided with enlarged heads holding the ends of said tongues in front of the front wall 1, so that said yokes are supported frictionally on said front wall until given desired alignment. The outer ends of the yokes are provided with stiffening members 36 and 37 of insulating material to hold the coil form assemblies against deformation.

When the tuning apparatus has been assembled and it is desired to align the inductance windings relatively to the cores 28 and 29, this may conveniently be done by a toothed rod (not shown), inserted in one or the other of holes 38 and 39 in the front wall 1 and engaging a corresponding rack 40 or 41 on the adjacent edges of the yokes 26 and 27. After the aligning operation, the yokes 26 and 27 are preferably given permanent locations relatively to the front wall 1 by the application of suitable cement.

The slots 34 and 35 are provided with enlarged clearance openings at their upper ends to facilitate assembling the yokes 26 and 27 on the rear surface of the front wall 1 without the use of special tools of any kind and without employing special retaining devices, excepting that it is desirable to apply the cement referred to, after the inductance windings have been aligned by moving them relatively to the cores 28 and 29 as described.

Fixed capacitors 42 and 43 are conveniently mounted on one of the walls of the casing for connection with the windings carried by the coil forms 24 and 25 to complete the resonant circuits of which said inductance windings are parts. The tuning mechanism described is applicable in any case where it is desired to simultaneously tune two resonant circuits, whether the tuning ranges thereof are the same, for example, in tuned radio frequency receivers, or whether they are different as may be required, for example, in connection with superheterodyne receivers. In the latter case, one of the tuned resonant circuits, for example, the one employing the inductance winding on the coil form 24, may be for the purpose of tuning the antenna circuit, while the other inductance winding on the coil form 25 may be used to tune the oscillator circuit of the superheterodyne, and since the tuning range of the oscillator circuit is usually higher and narrower than the tuning range of the antenna circuit, the coil form 25 may in that case be made with a thicker wall than the coil form 24, to effect the difference referred to in tuning range, so that a fixed intermediate frequency will be produced throughout the tuning range of the tuning mechanism.

In practice, it is found that in many cases the crosshead 16 tends to acquire an electrical potential different from that of the mounting plate, for which reason it is desirable to electrically isolate the crosshead from the mounting plate. This may be done in several ways, first, by making the bearing blocks of insulating material, particularly where both the mounting plate and the crosshead are of metal; or second, the crosshead may be made of insulating material, and the bearing blocks may not be required where the insulating material is formed to engage the crosshead guiding slots in the mounting plate, particularly if the materials used provide suitable bearing surfaces of the crosshead on the mounting plate; or third, the mounting plate may be made of insulating material, and the desirability of using the bearing blocks may be determined in the same manner as in the second case. Any of these constructions, or a combination of them, affords a convenient means for isolating the crosshead electrically, from the mounting plate. Where the crosshead or the bearing blocks are made of insulating material, a convenient means is provided for electrically isolating the cores from each other, where such a condition is desired.

The crosshead may have any form that will accomplish the result described, a principal requisite being that it shall have at least three bearing points on the mounting plate, that are substantially spaced from each other in two directions, thereby imparting to all parts of the crosshead similar rectilinear movement, and thus synchronizing the movements of the cores with each other for a given movement of the crosshead.

Generically, the invention includes a crosshead having rectilinear movement, suitable operating means, and operating connections between said operating means, the ends of the cores of the tuner, and the crosshead, by which the movement of said cores is effected.

For the sake of clearness in presenting the mechanical structure of the invention, inductance windings are not shown on the coil forms and electrical circuit connections are omitted, it being understood that in using the invention suitable inductance windings are used on the coil forms and the requisite electrical connections are provided in accordance with known teachings of the art, to meet the requirements involved. The tuner mechanism described is simple and inexpensive in construction and effective in operation, the parts involved are reduced to a minimum, and the size of the mechanism is much less than heretofore thought to be necessary.

While I have shown my invention in the particular embodiment described, it will be understood that I do not limit myself thereto as I may employ equivalents thereof without departing from the scope of the appended claims.

Having thus described my invention, what I claim is:

1. In a radio tuning mechanism for moving cores relatively to associated inductance coils to effect permeability tuning, the combination of a mounting plate, a crosshead of flat sheet material mounted adjacent and spaced from the outer surface of said mounting plate, a tuning shaft supported by said mounting plate and extending therethrough, said mounting plate having parallel slots therethrough containing rearward extensions from at least three substantially spaced portions of said crosshead, said extensions having sliding engagement with the edge portions of said slots, a drum on said shaft back of said mounting plate, a flexible band around said drum and connected with said crosshead and extending in a loop therefrom with its side members spaced from each other, guiding means remote from said drum and supporting said loop under tension, and a tuner-operating member extending from said crosshead.

2. In a radio tuning mechanism for moving cores relatively to associated inductance coils to effect permeability tuning, the combination of a mounting plate, a crosshead of flat sheet material mounted adjacent and spaced from the outer surface of said mounting plate, a tuning shaft supported by said mounting plate and extending therethrough, said mounting plate having parallel slots therethrough containing rearward extensions from at least three substantially spaced portions of said crosshead, said extensions having sliding engagement with the edge portions of said slots, a drum on said shaft back of said mounting plate, a flexible band around said drum and connected with said crosshead and extending in a loop therefrom with its side members spaced from each other, guiding means remote from said drum and supporting said loop under tension, said guiding means comprising a stationary structure back of and spaced from said mounting plate, and a tuner-operating member extending from said crosshead.

3. In a radio tuning mechanism for moving cores relatively to associated inductance coils to effect permeability tuning, the combination of a mounting plate, a crosshead of flat sheet material mounted adjacent and spaced from the outer surface of said mounting plate, a tuning shaft supported by said mounting plate and extending therethrough, said mounting plate having parallel slots therethrough containing rearward extensions from at least three substantially spaced portions of said crosshead, said extensions having sliding engagement with the edge portions of said slots, a drum on said shaft back of said mounting plate, a flexible band around said drum and connected with said crosshead and extending in a loop therefrom with its side members spaced from each other, guiding means remote from said drum and supporting said loop under tension, said crosshead having side legs for receiving said shaft between them, and a tuner-operating member extending from said crosshead.

4. In a radio tuning mechanism for moving cores relatively to associated inductance coils to effect permeability tuning, the combination of a mounting plate, a crosshead of flat sheet material mounted adjacent and spaced from the outer surface of said mounting plate, a tuning shaft supported by said mounting plate and extending therethrough, said mounting plate having parallel slots therethrough containing rearward extensions from at least three substantially spaced portions of said crosshead, said extensions having sliding engagement with the edge portions of said slots, a drum on said shaft back of said mounting plate, a flexible band around said drum and connected with said crosshead and extending in a loop therefrom with its side members spaced from each other, guiding means remote from said drum and supporting said loop under tension, said crosshead supporting slots having enlarged end clearance portions facilitating mounting said crosshead on said mounting plate, and a tuner-operating member extending from said crosshead.

5. In a rado tuning mechanism for moving cores relatively to associated inductance coils to effect permeability tuning, the combination of a mounting plate, a crosshead of flat sheet material mounted adjacent and spaced from the outer surface of said mounting plate, a tuning shaft supported by said mounting plate and extending therethrough, said mounting plate having parallel slots therethrough containing rearward extensions from at least three substantially spaced portions of said crosshead, said extensions having sliding engagement with the edge portions of said slots, a drum on said shaft back of said mounting plate, a flexible band around said drum and connected with said crosshead and extending in a loop therefrom with its side members spaced from each other, guiding means remote from said drum and supporting said loop under tension, said guiding means comprising an abutment extending rearwardly from said mounting plate and having a groove engaging said band, and a tuner-operating member extending from said crosshead.

6. In a radio tuning mechanism for moving cores relatively to associated inductance coils to effect permeability tuning, the combination of a crosshead mounted for vertical movement upon a mounting plate, operating means for said crosshead and supported by said mounting plate, said mounting plate having crosshead guiding slots therein, said crosshead including at least three projections horizontally extending through said slots for sliding engagement therewith, said projections being substantially spaced in two directions from each other, the vertical spacing between said projections being at least as long as cores to be operated by said crosshead, the lowermost of said projections being substantially in horizontal alignment with the position of the lower ends of the cores, whereby the height of said mounting plate may be a minimum and the movements of the cores will synchronize with each other for vertical movement of said crosshead.

WILLIAM A. SCHAPER.

REFERENCES CITED

The following references are of record in the file of this patent:

UNITED STATES PATENTS

| Number | Name | Date |
|---|---|---|
| Re. 19,448 | Johnson | Feb. 5, 1935 |
| 852,115 | Harris | Apr. 30, 1907 |
| 2,130,780 | Utrecht | Sept. 20, 1938 |
| 2,190,082 | Polydoroff | Feb. 13, 1940 |
| 2,217,984 | Kirk | Oct. 15, 1940 |
| 2,260,985 | Benton et al. | Oct. 28, 1941 |
| 2,286,283 | Kirk | June 16, 1942 |